United States Patent [19]

Webb

[11] Patent Number: 4,700,209
[45] Date of Patent: Oct. 13, 1987

[54] AVALANCHE PHOTODIODE AND A METHOD OF MAKING SAME

[75] Inventor: Paul P. Webb, Beaconsfield, Canada

[73] Assignee: RCA Inc., Toronto, Canada

[21] Appl. No.: 792,915

[22] Filed: Oct. 30, 1985

[51] Int. Cl.[4] .................. H01L 29/90; H01L 27/14
[52] U.S. Cl. ........................... 357/13; 357/30; 357/16
[58] Field of Search ..................... 357/13, 16, 30

[56] References Cited

U.S. PATENT DOCUMENTS

| | | | |
|---|---|---|---|
| 4,116,733 | 9/1978 | Olsen et al. | 148/175 |
| 4,442,444 | 4/1984 | Osaka | 357/13 |
| 4,481,523 | 11/1984 | Osaka et al. | 357/30 |
| 4,586,066 | 4/1986 | McIntyre | 357/13 X |
| 4,586,067 | 4/1986 | Webb | 357/13 X |
| 4,587,544 | 5/1986 | Webb | 357/13 X |
| 4,654,678 | 3/1987 | Lightstone | 357/13 X |
| 4,656,494 | 4/1987 | Kobayashi | 357/13 X |

OTHER PUBLICATIONS

G. H. Olsen et al., Journal of Electronic Materials, 9, 977, (1980).
G. H. Olsen in GaInAsP Alloy Semiconductors, T. P. Pearsall, Editor, John Wiley & Sons (New York 1982), pp. 11-41.
F. Capasso et al., Technical Digest of the 1984 Optical Fiber Conference, Jan. 23-25, 1984, New Orleans, La., pp. 88-89.

Primary Examiner—Martin H. Edlow
Attorney, Agent, or Firm—Raymond A. Eckersley

[57] ABSTRACT

The invention relates to an avalanche photodetector having a charge-multiplication region which is spatially separated from the detector surface. This photodetector includes a light-absorptive region, an active region overlying the absorptive region and having a central zone which has a greater concentration of conductivity modifiers than the remainder of the active region. A cap region overlies the first region, has the opposite conductivity type and extends a greater distance in the lateral direction than the central zone. The invention is also a method of forming this detector comprising the steps of forming a first region of the active region, embedding an excess concentration of conductivity modifiers into a portion thereof and then forming a second region of the active region on the first region. A cap region of opposite conductivity type is then formed over the active region. The cap region has a greater lateral extent than the portion containing the excess concentration of conductivity modifiers.

6 Claims, 5 Drawing Figures

AVALANCHE PHOTODIODE AND A METHOD OF MAKING SAME

The governments of the United States of America and Canada have rights in this invention pursuant to Canadian Sub-contract No. 14SU70C33-81-R-0122 under Contract No. F19628-82-C-0038 awarded by the U.S. Department of the Air Force.

The invention relates to an avalanche photodetector having a reduced electric field at the periphery of the P-N junction and a method of making this detector.

BACKGROUND OF THE INVENTION

Optical communication systems which operate in the wavelength range between about 1100 and 1700 nanometers (nm) are of potentially great importance because the dispersion and losses in an optical fiber are typically very low in this wavelength range. Heterojunction devices incorporating binary III-V alloys and solid solutions of these alloys have been found to be particularly useful for this application because their electronic bandgaps occur in this wavelength range and lattice-matched heterojunctions can be obtained by compositional variation. In particular ternary and quaternary alloys of InGaAsP on an InP substrate have been found to be useful materials for both light emitters and detectors.

Problems which affect the performance of avalanche photodetectors using these materials include bulk tunneling currents which occur at electric fields of the order of $1.5 \times 10^5$ V/cm in the ternary and quaternary compounds used for the light absorptive region, edge breakdown, and multiplication of surface leakage currents at the junction periphery. The tunneling has been reduced by locating the P-N junction with its high electric field in a wide bandgap material separated from the light absorptive region in the narrower bandgap material.

Edge breakdown and surface leakage currents have been reduced by the use of surface contouring of the detector sidewalls. However, the electric field reduction at the surface may be small with the result that the surface leakage current may still undergo multiplication. Therefore, it is desirable to find other device structures which will reduce the electric field at the junction periphery to an acceptable level.

SUMMARY OF THE INVENTION

An avalanche photodiode includes a light absorptive region of first conductivity type, an active region of first conductivity type overlying the light absorptive region and containing a central zone, and a cap region of the opposite conductivity type overlying the active region. The central zone has a greater concentration of first type conductivity modifiers than the active region and a lesser lateral extent than the cap region.

The invention is also a method of making this avalanche photodiode which comprises the steps of forming a first region of first conductivity type on a surface of the light absorptive region, embedding additional first type conductivity modifiers into a central portion of said first region, forming a second region of first conductivity type on said first region and forming a cap region of opposite conductivity type on said second region. The step of embedding the first type conductivity modifiers is carried out such that the lateral extent of the central portion is less than that of the cap region.

DETAILED DESCRIPTION OF THE PREFERRED EMBODIMENTS

In the FIGURES the same numerical identification is used for corresponding elements.

Figure 1:
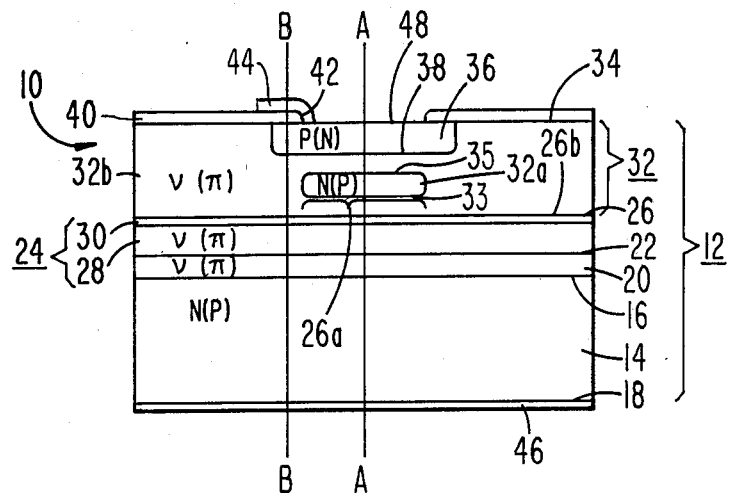
FIGS. 1 and 2 are cross-sectional views of two embodiments of the avalanche photodetector of the invention.

In FIG. 1 the photodetector 10 includes a body of semiconductor material 12. The body 12 includes a substrate 14 having first and second major surfaces 16 and 18, respectively, and a buffer layer 20 having a surface 22 which overlies the first major surface 16. A light absorptive layer 24 having a surface 26 overlies the surface 22 of the buffer layer 20 and is composed of a first part 28 which absorbs light at the wavelength of interest and a second part 30 which has a bandgap intermediate that of the first part 28 and that of an active layer 32 which overlies the surface 26 of the absorptive layer 24. The surface 26 comprises a central surface area 26a surrounded by a peripheral surface area 26b. The active region 32 has a surface 34 and includes a central zone 32a over the central surface area 26a. The central zone 32a has a first interface 33 spaced a distance from the central surface are 26a and a second interface 35 spaced a distance from a cap region 36 which extends a distance into the active region 32 from the surface 34. The cap region 36 has a greater lateral extent, the direction in the plane of the surface 34, than the central zone 32a. A P-N junction 38 is formed at the interface between the active region 32 and the cap region 36. A passivating layer 40 overlies the surface 34 and has an opening 42 extending therethrough over the cap region 36. A first electrical contact 44 overlies a portion of the surface 34 exposed in the opening 42 to provide electrical contact to the cap region 36 and a second electrical contact 46 overlies the second major surface 18. The first and second electrical contacts 44 and 46, respectively, are a means for providing an electrical contact to the semiconductor body 12. Light incident on the avalanche photodetector 10 typically enters the semiconductor body 12 through the portion 48 of the surface 34 exposed in the opening 42.

Figure 2:
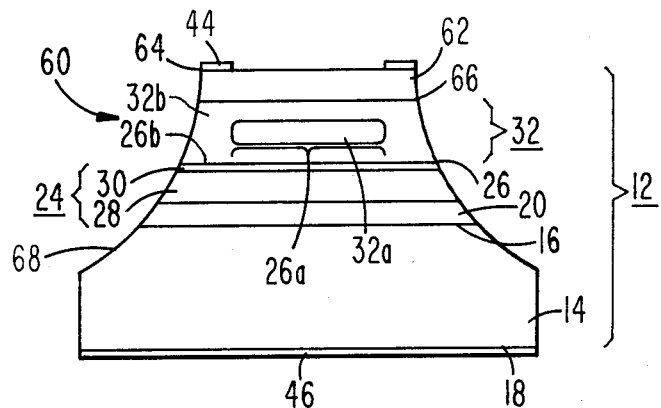

In FIG. 2 a photodetector 60 includes a cap region 62 having a surface 64 overlying a surface 66 of the active region 32. The first electrical contact 44 overlies a portion of the surface 64 and has an opening extending therethrough so that light incident on the device enters the semiconductor body 12 through the portion of the surface 64 exposed in an opening. The first electrical contact 44 and the second electrical contact 46 comprise means for making electrical contact to the semiconductor body 12. The photodetector 60 also has a contoured sidewall 68.

The substrate 14 and the buffer, absorptive and active regions 20, 24 and 32, respectively, are of the same conductivity type and the cap region 36 or 62 is of the opposite conductivity type. Materials comprising the buffer, absorptive, active and cap regions are preferably chosen such that their lattice constants are matched to that of the substrate to within about 0.5 percent.

The substrate 14 is typically composed of a semiconductor material such as N-type InP doped with sulfur to a concentration of about $5 \times 10^{18}$/cm$^3$, has sufficient thickness to support the remainder of the structure and is typically between about 0.03 and 0.04 cm thick. The major surfaces 16 and 18 are typically treated with Caro's acid in a one percent bromine-in-methanol solution to remove surface contamination and damage prior to the deposition of the layers. The buffer region 20 is typically composed of the same compound, is undoped and is typically between about 1 and 3 micrometers ($\mu$m) thick. The first part 28 of the absorptive region 24 is typically composed of a material which absorbs light at the wavelength of interest in the range between about 1100 and 1700 nm. Suitable materials include In$_{0.53}$Ga$_{0.47}$As which absorbs at wavelengths less than about 1650 nm and In$_x$Ga$_{1-x}$As$_y$P$_{1-y}$ which absorbs light at wavelengths less than a maximum wavelength determined by the choice of x and y as disclosed, for example, by Olsen et al. in The Journal of Electronic Materials 9, 977 (1980). This layer is preferably slightly $\nu$-type conducting and is typically deposited as undoped material containing less than about $3 \times 10^{15}$ donors/cm$^3$. The first part 28 is preferably greater than about 2 $\mu$m thick to provide complete absorption of the incident light. The second part 30 of the absorptive region 24 is composed of material, typically In$_a$Ga$_{1-a}$As$_b$P$_{1-b}$ having a bandgap energy between that of the first part 28 and the active region 32 and is typically less than about 0.5 $\mu$m thick. The concentration of conductivity modifiers is preferably the same as that in the first part 28. This second part is present to avoid the slow detector response associated with the accumulation of charge carriers near the valence band discontinuity at the heterojunction with the active region 32 but may be omitted. The active region 32 is typically composed of a semiconductor material such as InP having an excess conductivity modifier concentration less than about $10^{16}$/cm$^3$ and is typically between about 1 and 3 $\mu$m thick. The central zone 32a typically has N-type conductivity and contains an excess areal concentration of conductivity modifiers above the background concentration. This zone is typically between about 0.1 and 0.3 $\mu$m thick and is embedded in the active region 32 so that it is spaced apart from both the surface 26 of the absorptive region 24 and the surface 34 of the active region 32. The lateral extent of the central zone 32a is always less than that of the cap region 36. The cap region 36 or 62 is typically composed of a light transmissive semiconductor material, such as P-type InP, containing an excess of about $10^{18}$ acceptors/cm$^3$ and having a thickness between about 1 and 2 $\mu$m. The first electrical contact 44 is typically composed of a gold/zinc alloy deposited by vacuum evaporation if the cap region is P-type and is preferably configured so that light enters the detector through that part of the cap region over the central zone 32a. The second electrical contact 46 is typically composed of a gold/tin alloy deposited by vacuum evaporation if the substrate 14 has N-type conductivity. The passivating layer 40 is typically composed of material such as SiO$_2$, borophosphosilicate glass or Si$_3$N$_4$ deposited using evaporation or chemical vapor deposition techniques.

The different regions of the semiconductor body 12 may be sequentially formed on a substrate surface using liquid phase or, preferably, vapor phase epitaxy techniques such as those disclosed by Olsen et al. in U.S. Pat. No. 4,116,733 or by Olsen in *GaInAsP Alloy Semiconductors*, T. P. Pearsall, Editor, John Wiley & Sons (New York 1982), pages 11–41.

Figure 3:
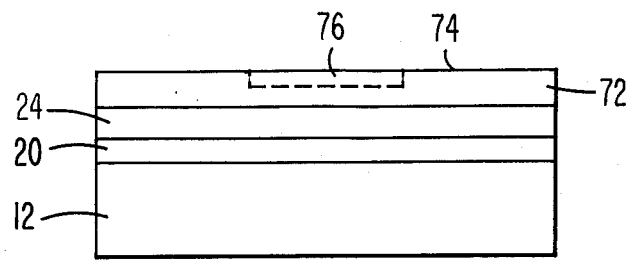
FIGS. 3 and 4 are cross-sectional views of a semiconductor body at different steps in the fabrication of the avalanche photodetector of the invention.
Figure 4:
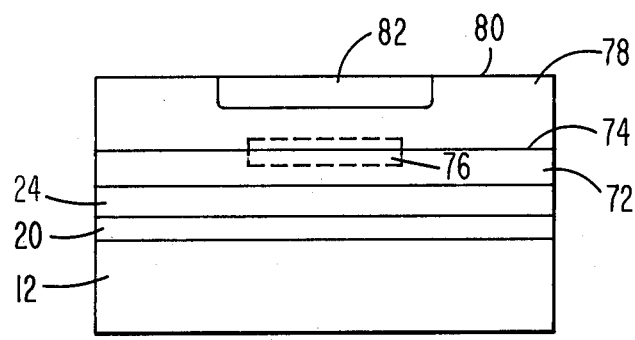

As shown in FIG. 3, the photodiode 10 is formed by sequentially forming the buffer layer 20, the light absorptive layer 24 and a first part 72 of the active layer 32 which is typically between about 0.5 and 1 $\mu$m thick. Conductivity modifiers are then embedded into a surface 74 of the first part 72, preferably by ion implantation, into a central portion 76 thereof to a depth of about 0.1 $\mu$m. As shown in FIG. 4, a second part 78 of the active layer 32 is then formed on the surface 74 to a thickness between about 1 and 3 $\mu$m. Conductivity modifiers of the opposite type are then embedded, typically by diffusion techniques, into a surface 80 of the second part 78 to form the cap region 82 over the central portion 76. The excess conductivity modifier concentration in the central portion 76 diffuses into the second part 78 during subsequent high temperature processing steps so that this portion has a width between about 0.5 and 2 $\mu$m.

To form the photodetector 60 of FIG. 2 the cap region 62 is typically deposited onto the surface 66 of the active region 32 and the contoured sidewalls 68 are then formed using standard photolithographic and etching techniques.

Figure 5:
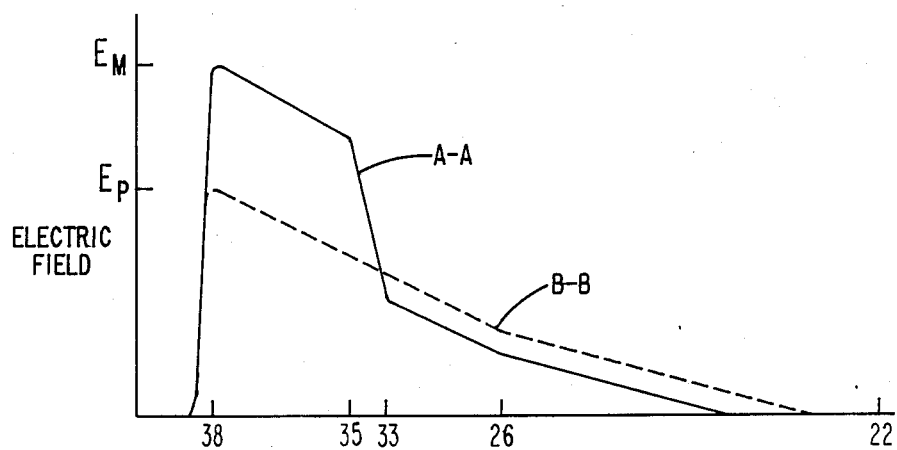
FIG. 5 is a graphical illustration of the electric field distribution along the lines A—A and B—B of FIG. 1.

In the operation of the photodetector of the invention a reverse bias voltage is applied between the electrical contacts. The depletion region along the line A—A of FIG. 1 increases with increasing voltage, with the electric field reaching a value of between about 3.5 and $5 \times 10^5$ V/cm when the active region 32, including the central zone 32a, is fully depleted. A further increase in the applied voltage causes the depletion region to extend into the absorptive region 24 where the electric field does not increase beyond about $1.0 \times 10^5$ V/cm before an electric field $E_M$ sufficient for avalanche breakdown is reached at the P-N junction 38. Assuming an abrupt P-N junction, the peak electric field $E_M$ along the line A—A of FIG. 1, when the depletion region extends into the absorptive region 24, is:

$$E_M = -\frac{q}{\epsilon}[N_A x + N_o + N_t w_c]$$

where q is the electronic charge, $\epsilon$ is the dielectric constant, $N_A$ is the conductivity modifier volume concentration in the active region 32, x is the thickness of the active region between the P-N junction 38 and the surface 26 of the absorptive region 24, $N_o$ is the embedded areal conductivity modifier concentration in the central zone 32a, $N_t$ is the conductivity modifier volume concentration and $w_c$ is the thickness of the depletion region in the absorptive region 24. $N_o$ is typically between about 2 and $4 \times 10^{12}$/cm$^2$. The first two terms represent the electric field necessary to deplete the active region 32 including the central zone 32a. For example, if the electric field for avalanche multiplication is approximately $5 \times 10^5$ V/cm then the field to deplete the active region 32 must be greater than about $3.5 \times 10^5$ V/cm, and less than about $4.7 \times 10^5$ V/cm, and preferably about $4.5 \times 10^5$ V/cm. This electric field distribution is illustrated as a solid curve, labelled A—A, in FIG. 5 where the numbers on the abcissa correspond to the labels on the surfaces of the photodetector 10 of FIG. 1.

The peripheral zone 32b will also fully deplete with the application of reverse-bias voltage. However, since the central zone 32a is not present, the maximum electric field $E_M$ along the lines B—B of FIG. 1 will be less than that along the line A—A and also less than the field required for avalanche multiplication. The electric field $E_P$ in the peripheral zone 32b when the depletion region extends into the absorptive region 26 is:

$$E_P = -\frac{g}{\epsilon}[N_A x + N_t w_p]$$

where $w_p$ is the thickness of the depletion region in the absorptive region 24 at the periphery. Thus, the electric field at the heterojunction 26 on the periphery will be greater than that at the center of the detector. This electric field distribution is illustrated as the broken curve, labelled B—B, in FIG. 5.

I claim:

1. An avalanche photodetector comprising a semiconductor body, said body including:
   a light absorptive region having a major surface;
   an active region overlying said major surface and having a central zone therein;
   a cap region overlying said active region over said central zone, said cap region having a lateral extent greater than that of said central zone; and
   means for electrically contacting said semiconductor body;
   said absorptive and active regions and said central zone having one conductivity type and said cap region having the opposite conductivity type;
   said central zone having a greater concentration of first type conductivity modifiers than the remainder of said active region and being spaced apart from said absorptive and cap regions within said active region.

2. The photodetector of claim 1, wherein the areal concentration of conductivity modifiers in said central zone is between about 2 and $4 \times 10^{12}/cm^2$.

3. The photodetector of claim 2, wherein said central zone is between about 0.1 and 0.3 micrometers thick.

4. The photodetector of claim 3, further comprising a substrate with said absorptive region overlying a surface of said substrate.

5. The photodetector of claim 4, further comprising a buffer layer overlying said surface of said substrate and said absorptive overlying a surface of said buffer layer.

6. The photodetector of claim 3, wherein said substrate is composed of N-type InP, said absorptive region is composed of a $\nu$-type material selected from a group consisting of $In_{0.57}Ga_{0.43}As$ and $In_xGa_{1-x}As_yP_{1-y}$ alloys, said active region is composed of $\nu$-type InP and said cap region is composed of P-type InP.

* * * * *